(12) United States Patent
Huang

(10) Patent No.: US 8,339,563 B2
(45) Date of Patent: Dec. 25, 2012

(54) LIQUID CRYSTAL IMAGER AND METHOD OF MAKING SAME

(75) Inventor: Herb He Huang, Shanghai (CN)

(73) Assignee: Shanghai Lexvu Opto Microelectronics Technology Co., Ltd, Shanghai (CN)

( * ) Notice: Subject to any disclaimer, the term of this patent is extended or adjusted under 35 U.S.C. 154(b) by 226 days.

(21) Appl. No.: 12/885,836

(22) Filed: Sep. 20, 2010

(65) Prior Publication Data
US 2011/0069264 A1 Mar. 24, 2011

Related U.S. Application Data

(60) Provisional application No. 61/244,180, filed on Sep. 21, 2009.

(51) Int. Cl.
G02F 1/1345 (2006.01)
G02F 1/1339 (2006.01)

(52) U.S. Cl. ........................................ 349/151; 349/153

(58) Field of Classification Search .................. 349/151, 349/153
See application file for complete search history.

(56) References Cited

U.S. PATENT DOCUMENTS

| 5,832,601 | A | 11/1998 | Eldridge et al. | |
|---|---|---|---|---|
| 5,963,289 | A | 10/1999 | Stefanov et al. | |
| 7,714,974 | B2 * | 5/2010 | Lee et al. | 349/153 |
| 2004/0196418 | A1 * | 10/2004 | Hashimoto et al. | 349/113 |
| 2005/0052600 | A1 * | 3/2005 | Hashimoto et al. | 349/130 |
| 2005/0231662 | A1 * | 10/2005 | Isozaki et al. | 349/113 |
| 2006/0082716 | A1 * | 4/2006 | Lebrun et al. | 349/153 |
| 2006/0215102 | A1 * | 9/2006 | Otose et al. | 349/151 |
| 2010/0315579 | A1 * | 12/2010 | Huang | 349/113 |
| 2010/0328590 | A1 * | 12/2010 | Huang | 349/113 |
| 2011/0007249 | A1 * | 1/2011 | Huang | 349/106 |
| 2011/0007382 | A1 * | 1/2011 | Huang | 359/296 |
| 2011/0025957 | A1 * | 2/2011 | Huang | 349/96 |
| 2011/0069264 | A1 * | 3/2011 | Huang | 349/122 |

* cited by examiner

Primary Examiner — Rhonda Peace
(74) Attorney, Agent, or Firm — J.C. Patents

(57) ABSTRACT

The disclosed LCOS device comprises a transparent composite plate, a planar liquid crystal cell, a base plate which contains an active matrix driving circuitry. In the basic embodiment, the planar liquid crystal cell comprises a conductive seal ring which encloses liquid crystal filling and connects the transparent conductive layer underneath the transparent composite plate with the base plate and the active matrix driving circuitry. In the extended embodiment, the base plate further incorporates a set of thru-substrate via and backside bond pads. The set of thru-substrate via electrically connect a set of input-output pads of the active matrix driving circuitry to the bottom bond pads underneath the base plate. In addition, the conductive seal ring electrically connects the transparent conductive film placed underneath the transparent front plane plate, preferably made of glass, to the active matrix driving circuitry on the base plate. Electrostatically charged between the transparent conductive coating and an electrode array layer including a planar array of reflective pixel electrodes on top of the base plate, planar liquid crystal cell is operated to produce spatial light modulation to incident illumination. The method of wafer level process and packaging of the disclosed LCOS imagers is further disclosed.

24 Claims, 7 Drawing Sheets

LIQUID CRYSTAL IMAGER AND METHOD OF MAKING SAME

CROSS-REFERENCE TO RELATED APPLICATIONS

This application claims priority of provisional application No. 61/244,180, filed on Sep. 21, 2009, entitled "LIQUID CRYSTAL IMAGER AND METHOD OF MAKING SAME", which is incorporated herein by reference in its entirety.

FIELD OF THE TECHNOLOGY

The present invention is generally related to the manufacture of silicon-based liquid crystal imagers and, particularly, to liquid crystal on silicon microdisplay imagers with input and output bond pads routed onto the backside by thru-substrate via and the front conductive charging film electrically connected to the active matrix driving circuitry through the conductive seal ring, as well as the method of wafer level packaging thereof.

BACKGROUND

Liquid Crystal On Silicon (LCOS) imagers are a spatial light modulation microdevice which basically comprises a glass cover and a backplane substrate, together sandwiching a thin liquid crystal cell sealed by a close-loop seal ring, while the backplane substrate contains a CMOS-based active matrix driving circuitry. A LCOS imager is thus configured for receiving, modulating and reflecting incident polarized illumination from its front side as in situ instructed by the active matrix driving circuitry.

In the conventional configuration disclosed in the prior art, the input and output bond pads of a LCOS imager are placed at edge on the top-side of the backplane substrate where the glass cover is cut off to facilitate wiring of the input and output bond pads. Meanwhile, the backplane substrate is further die sawed asymmetrically to have one edge of the glass cover extend out beyond the backplane substrate to make ease wiring of the ITO underneath the glass cover. Such packaging configuration of a LCOS imager is not convenient for its assembly and application system integration as being not in line with the modem electronic system packaging framework, which desires a backside bond pad configuration like BGA. And even the according manufacturing process is specialized but not efficient.

SUMMARY

One aspect of the present invention provides a liquid crystal imager which comprises:
- a transparent front plane plate, the transparent front plane plate including transparent front plane substrate, a transparent conductive coating and a top liquid crystal alignment film;
- a planar liquid crystal cell, the planar liquid crystal cell including a conductive seal ring and a liquid crystal filling enclosed by the conductive seal ring;
- a backplane plate, the backplane plate including a bottom liquid crystal alignment film, an electrode array layer and a backplane substrate, the electrode array layer containing a transmit cell connection pad and an planar array of reflective pixel electrodes and being electrically isolated by an electrode isolator, and the backplane substrate containing an active matrix driving circuitry;

wherein the conductive seal ring electrically connects the transparent conductive coating to the transmit cell connection pad; the driving circuitry are electrically connected to the transmit cell connection pad and the planar array of reflective pixel electrodes.

Another aspect of the present invention is to provide a method of manufacturing a liquid crystal imager, which comprises:
- providing a backplane plate having a plurality of processed dies, the dies arranged in a generally orthogonal array with horizontal and vertical scribe lines between the dies, each die containing a set of input-output pads and an active matrix driving circuitry on a backplane substrate, and an electrode array layer which comprises a transmit cell connection pad and an planar array of reflective pixel electrodes;
- providing a transparent front plane substrate;
- depositing a conductive transparent coating on the transparent front plane substrate;
- forming a top liquid crystal alignment film onto the conductive transparent coating;
- depositing a second sacrificial coating onto the top liquid crystal alignment film;
- photolithographically patterning the second sacrificial coating to form a second grid of trenches through the second sacrificial coating, each gridded square in association with one processed die;
- using the patterned second sacrificial coating as photolithographic mask, etching the top liquid crystal alignment film to selectively expose the conductive transparent coating according to a second grid of trenches, substantially identical to the first grid of trenches on the backplane plate;
- selectively removing the second sacrificial coating;
- adherently bonding the transparent front plane substrate to the backplane plate in an optical alignment such that the array of conductive sealing rings adhere to the exposed conductive transparent coating beneath the transparent front plane substrate and to the transmit cell connection pad above the backplane plate to form an array of cavities surrounded by the array of conductive sealing rings;
- dicing through the bonded pair of the transparent front plane substrate and the backplane plate along the scribe lines to separate the processed dies;
- filling and sealing the cavity of each processed die with liquid crystal material to form a liquid crystal imager.

Another aspect of the present invention is to provide a method of manufacturing a liquid crystal imager on a wafer backplane substrate, which comprises:
- providing a backplane plate having a plurality of processed dies, the dies arranged in a generally orthogonal array with horizontal and vertical scribe lines between the dies, each die containing a set of input-output pads and an active matrix driving circuitry on a backplane substrate, and an electrode array layer which comprises a transmit cell connection pad and an planar array of reflective pixel electrodes;
- providing a transparent front plane substrate;
- depositing a conductive transparent coating on the transparent front plane substrate;
- forming a top liquid crystal alignment film on top of the conductive transparent coating;
- depositing a second sacrificial coating onto the top liquid crystal alignment film;
- photolithographically patterning the second sacrificial coating to form a second grid of trenches through the second sacrificial coating, each gridded square in association with one processed die;

using the patterned second sacrificial coating as photolithographic mask, etching the top liquid crystal alignment film to selectively expose the conductive transparent coating according to the second grid of trenches;

depositing a conductive sealant film to fill the second grid of trenches;

selectively removing the excess sealant film beyond the second grid of trenches;

selectively removing the second sacrificial coating to form an array of conductive seal rings;

adherently bonding the transparent front plane substrate to the backplane plate in an optical alignment such that the array of conductive sealing rings adhere to the exposed conductive transparent coating beneath the transparent front plane substrate and to the transmit cell connection pad above the backplane plate to form an array of cavities surrounded by the array of conductive sealing rings;

dicing through the bonded pair of the transparent front plane substrate and the backplane plate along the scribe lines to separate the processed dies;

filling and sealing the cavity of a processed die with liquid crystal material to form a liquid crystal imager.

BRIEF DESCRIPTION OF THE DRAWINGS

The present invention can be more completely understood in consideration of the following detailed description of various embodiments in connection with the accompanying drawings, not particularly to the scale, in which.

DETAILED DESCRIPTION

Figure 1:
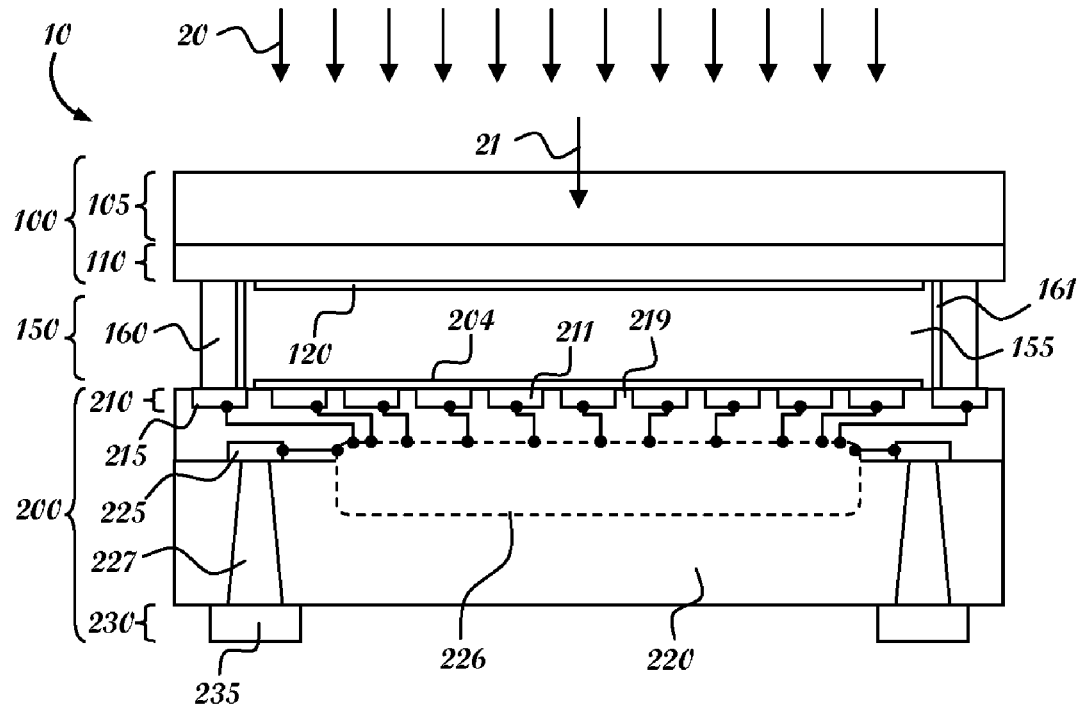
FIG. 1 is a cross-sectional view of a liquid crystal imager illustrating embodiments of the disclosed invention.

FIG. 1 is a cross-sectional view of a liquid crystal imager 10 illustrating the basic embodiments of the disclosed invention. The liquid crystal imager 10 comprises three composite layers: a transparent front plane plate 100, a planar liquid crystal cell 150 and a backplane plate 200 in a stacked, preferably adherently stacked, configuration in the order of receiving incident light 20 along the incident direction 21. Similar to conventional LCOS imagers, the transparent front plane plate 100 in the basic embodiments comprises a transparent front plane substrate 105, a transparent conductive coating 110 and a top liquid crystal alignment film 120 also in a stacked, preferably adherently stacked, configuration, while the backplane plate 200 comprises a bottom liquid crystal alignment film 204, an electrode array layer 210 and a backplane substrate 220, in the order of receiving the incident light 20 along the incident direction 21. The electrode array layer 210 contains at least one transmit cell connection pad 215 and a planar array of reflective pixel electrodes 211, while the backplane substrate 220 contains a set of input-output pads 225 and an active matrix driving circuitry 226. The active matrix driving circuitry 226 is electrically connected to all the reflective pixel electrodes 211 and the transmit cell connection pad 215 as well as the input-output pads 225.

One of the unique features in the disclosed liquid crystal imager 10 is that the planar liquid crystal cell 150 has a conductive seal ring 160 which encloses a liquid crystal filling 155, wherein the conductive seal ring 160 further electrically connects the transmit cell connection pad 215 on the backplane plate 200 to the transparent conductive coating 110 on the transparent front plane plate 100. Thus, electrostatically charged between the transparent conductive coating 110 and the planar array of reflective pixel electrodes 211, all being controlled by the active matrix driving circuitry 226, the planar liquid crystal cell 150 is operated to produce spatial light modulation to the incident light 20 as in conventional LCOS imagers. Herein the reflective pixel electrodes 211 are electrically isolated from each other by an electrode isolator 219.

In the preferred configuration, the transparent front plane substrate 105 is made from silicon oxide, or glass, while the transparent conductive coating 110 is made from any conductive material with relatively high optical transmittance close to or above 90%, for example, from any or combination of indium tin oxide, indium zinc oxide, nano carbon tubes and conductive polymers. The backplane substrate 220 in the backplane plate 200 is preferably made from single crystal silicon on which the active matrix driving circuitry 226 are fabricated, comprising the complementary and symmetrical pairs of p-type and n-type metal oxide semiconductor field effect transistors, or CMOS.

In one embodiment of this disclosed invention, the conductive seal ring 160 is made from a conductive thin film material, such as metal thin film including but not limited to any or combination of aluminum, copper, cobalt, nickel, tin, silver and gold. Equivalently, other pattern definable films are applicable as the base material for fabricating such conductive seal ring 160, including commonly available conductive glues such as silver conductive adhesive paste widely used in the integrated circuits and plastic board assemblies. A seal ring inner liner 161, made of harmless materials to liquid crystal preferably than the conductive seal ring 160, preferably dielectric such as silicon oxide and/or nitride, and carbon or non-conductive polymers, is optionally added to isolate the liquid crystal from the conductive seal ring 160 particularly if made of metals.

The top liquid crystal alignment film 120 and the bottom liquid crystal alignment film 204 are preferably made from any or combination of inorganic solid state materials, including but not limited to silicon oxide and silicon nitride which pertain certain etch removal selectivity required in the photolithography process via a photo-definable mask material.

In another basic embodiment, the backplane plate 200 further comprises a bottom connection pad layer 230 at the bottom side of the backplane substrate 220. The bottom connection pad layer 230 contains a set of bottom bond pads 235 of an equal number to the input-output pads 225 and the backplane substrate 220 further comprises a set of thru-substrate via 227 which electrically connect the input-output pads 225 individually to corresponding bottom bond pads 235. Thus the input-output pads 225 for the active matrix driving circuitry 226 are re routed onto the opposite side of the liquid crystal imager 10 to incident light 20, making it convenient to electrically attach the liquid crystal imager 10 to a plastic circuit board or flexible circuit associated with an application system.

Figure 2:
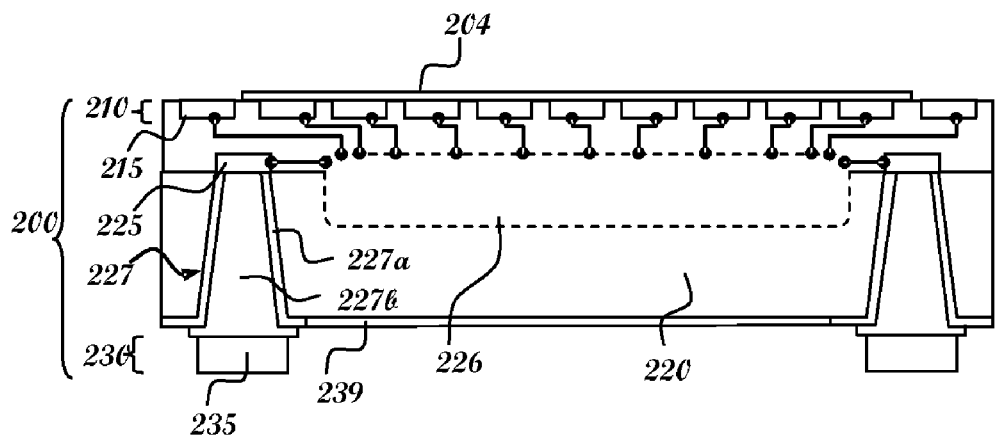
FIG. 2 is a cross-sectional view of a liquid crystal imager, in particular a backplane plate in an extended embodiment of the disclosed invention.

FIG. 2 is a cross-sectional view of a liquid crystal imager 10, in particular the backplane plate 200 in one extended embodiment of the disclosed invention. Therein each of the thru-substrate via 227 further comprises a cylindrical isolation shell 227a and a thru-substrate conductor 227b, the cylindrical isolation shell 227a surrounding and thus, electrically isolating the thru-substrate conductor 227b from the backplane substrate 220. The thru-substrate conductor 227b is preferably made from any or combination of aluminum, copper, tungsten, cobalt, titanium, tantalum, silver, platinum and gold, or any other metal or conductive material commonly available in conventional CMOS fabrication lines. Furthermore, the bottom bond pads 235 are electrically isolated from the backplane substrate 220 by a bottom bond pad isolator 239, preferably made from silicon oxides, nitrides, oxy nitrides, carbon oxy nitride among others including polyimide and other proper insulating material commonly available in the art. In one of the extended embodiment, the bottom bond pad isolator 239 is made of the same dielectric film as of the cylindrical isolation shell 227a, as processed simultaneously. In addition, the bottom bond pads 235 at the bottom side of the backplane plate 200 are electrically isolated by a bottom bond pad isolator 239, which is physically connected with the cylindrical isolation shells 227a in a preferred configuration so that the thru-substrate electrical interconnects from each set of the input-output pad 225, the thru-substrate conductor 227b and the bottom bond pad 235 are seamlessly isolated from the semiconductor backplane substrate 220.

Figure 3A:
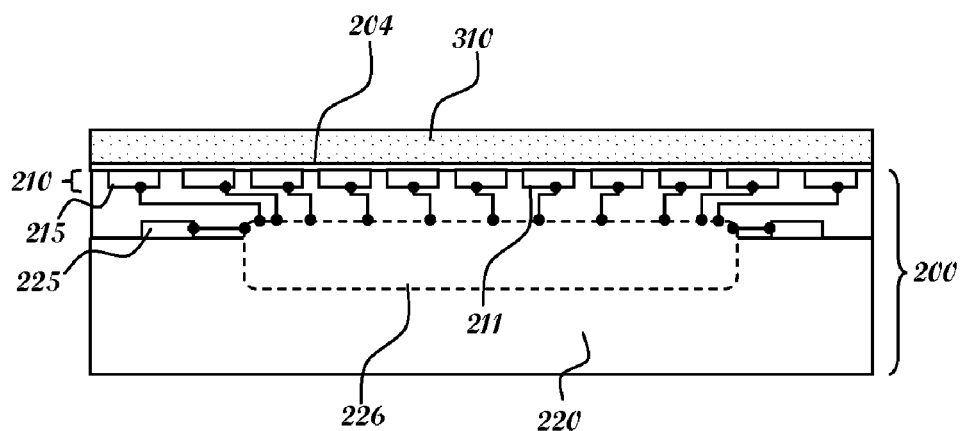
FIGS. 3a-3f are a series of cross-sectional views showing the sequence of the major steps of fabricating a liquid crystal imager in an embodiment of the present invention.

FIGS. 3a-3f are a series of cross-sectional views showing the sequence of the major steps of fabricating liquid crystal imagers 10 according to an embodiment of the present invention. Initially, a backplane plate 200 is provided having a plurality of processed dies fabricated and arranged in a generally orthogonal array with horizontal and vertical scribe lines between the dies, as disclosed in the prior art and in common industrial practice of liquid crystal imager fabrication. Each die contains an electrode array layer 210 which comprises a transmit cell connection pad 215 and a planar array of reflective pixel electrodes 211 on a backplane substrate 220, the backplane substrate 220 containing a set of input-output pads 225 and an active matrix driving circuitry 226 as processed previously through fabrication of the backplane plate. As shown in FIG. 3a, a bottom liquid crystal alignment film 204 is formed above the planar array of reflective pixel electrodes 211 and then a first sacrificial coating 310 is deposited above the bottom liquid crystal alignment film 204. In the preferred configuration of the basic embodiment, the first sacrificial coating 310 is made from solid state materials different from the inorganic material used for the bottom liquid crystal alignment film 204, but photo-definable such as solid state carbon films including amorphous or diamond like carbons (which are readily produced via plasma enhanced CVD process).

Figure 3B:
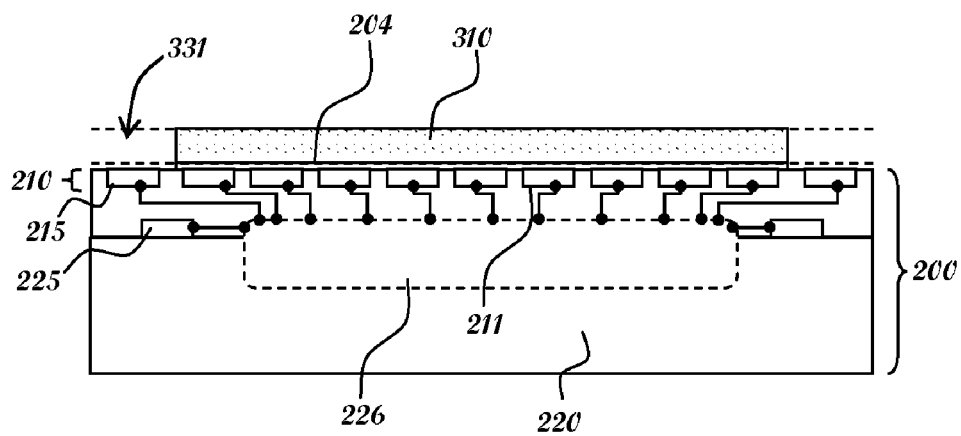
Figure 3C:
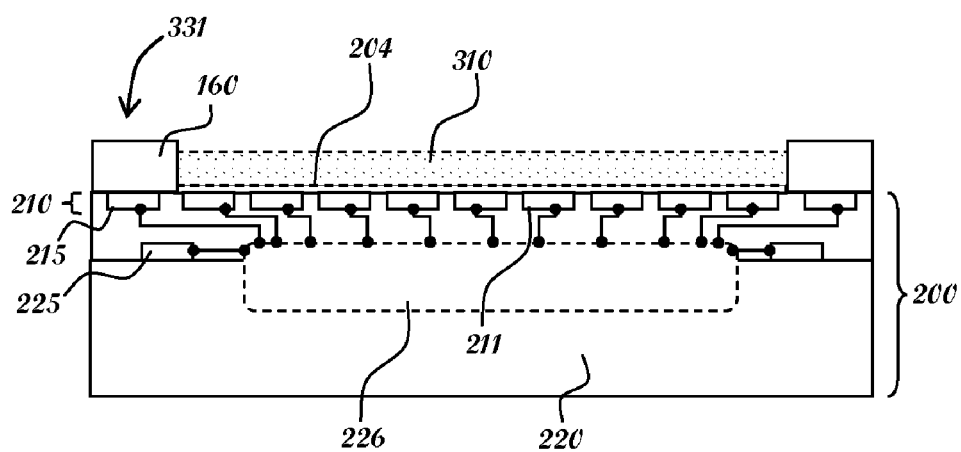

As shown in FIG. 3b, the first sacrificial coating 310 is then photolithographically patterned to form a first grid of trenches 331 through the first sacrificial coating 310, each gridded square being associated with one would-be-processed die (which eventually becomes a liquid crystal imager 10). Using the patterned first sacrificial coating 310 as photolithographic mask, the bottom liquid crystal alignment film 204 is etch patterned to selectively expose the transmit cell connection pad 215 according to the first grid of trenches 331. Furthermore, a conductive sealant film 160 is deposited onto the exposed the transmit cell connection pad 215 (as well as the patterned first sacrificial coating 310) and trimmed with the excess sealant material removed beyond the first grid of trenches 331, before the first sacrificial coating 310 is selectively removed to form the array of conductive seal rings 160, as shown in FIG. 3c. In the preferred embodiment of using a solid state carbon film or a photoresist film as the first sacrificial coating 310, plasma-enhanced ashing is used for selectively removing the first sacrificial coating 310 with minimum attack to the bottom liquid crystal alignment film 204 and the array of conductive seal rings 160.

Figure 3D:
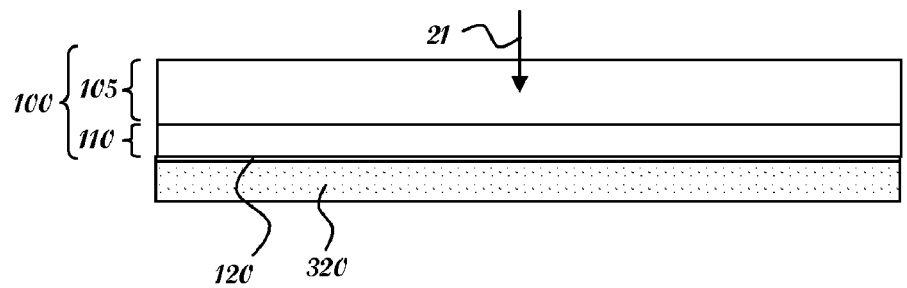
Figure 3E:
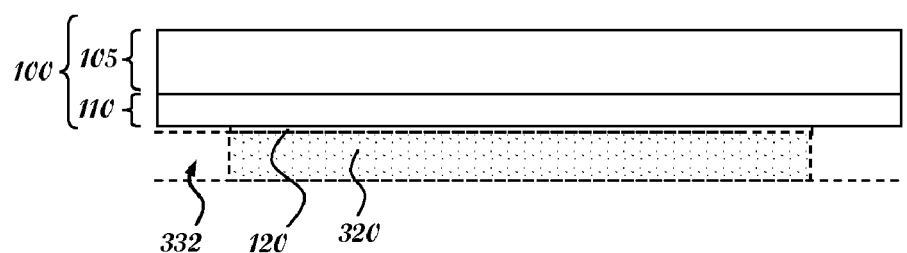

As shown in FIG. 3d, a transparent front plane substrate 105, preferably made of glass, is first deposited with a transparent conductive coating 110 and then with a top liquid crystal alignment film 120, preferably made of inorganic materials including silicon oxides and/or nitrides. A second sacrificial coating 320, either a photoresist film deposited via spin coating or a carbon film deposited via plasma enhanced CVD process, is formed onto the top liquid crystal alignment film 120. Then as shown in FIG. 3e, the second sacrificial coating 320 is lithographically patterned and used as the etch mask for further selectively etch removing the exposed portion of the top liquid crystal alignment film 120 and thus partially exposing the transparent conductive coating 110 along a second grid of trenches 332, which is substantially identical to the first grid of trenches 331 on the backplane plate 200. The transparent front plane substrate process ends with the second sacrificial coating 320 being selectively removed with the others intact.

Figure 3F:
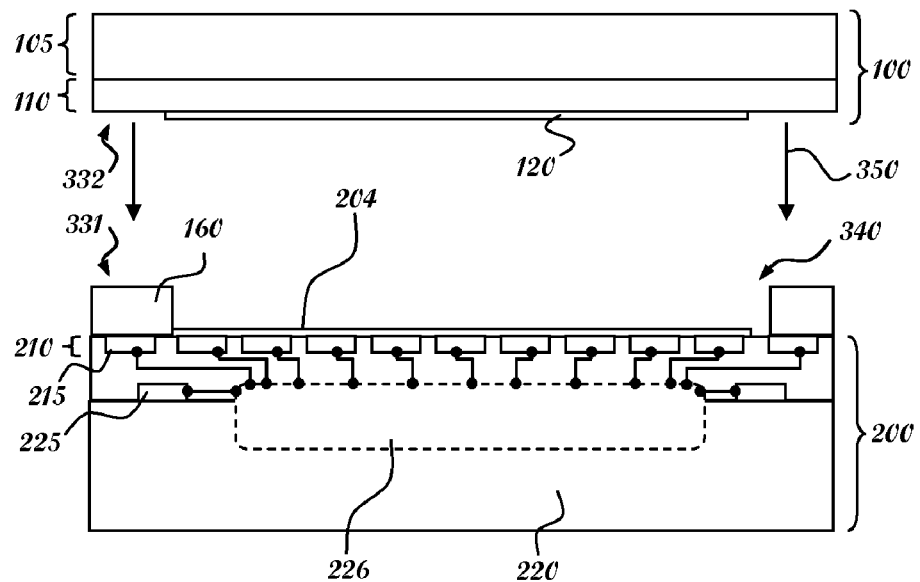

Finally as shown in FIG. 3f, the transparent front plane plate 100 is adherently bonded to the backplane plate 200 in an optical alignment such that the array of conductive seal rings 160 adheres to the exposed conductive transparent coating 110 on the transparent front plane palte 100 and to the transmit cell connection pad 215 on the backplane plate 200, to form an array of cavities 340 surrounded by the grid of conductive sealing rings 160. To separate the processed dies, dicing is applied through the bonded pair of the transparent front plane plate 100 and the backplane plate 200 along the scribe lines associated with the first (second) grid 331 (332) and eventually, the cavity 340 of each die is filled with liquid crystal material and sealed off to form a liquid crystal imager 10 (in FIG. 1).

Figure 4A:
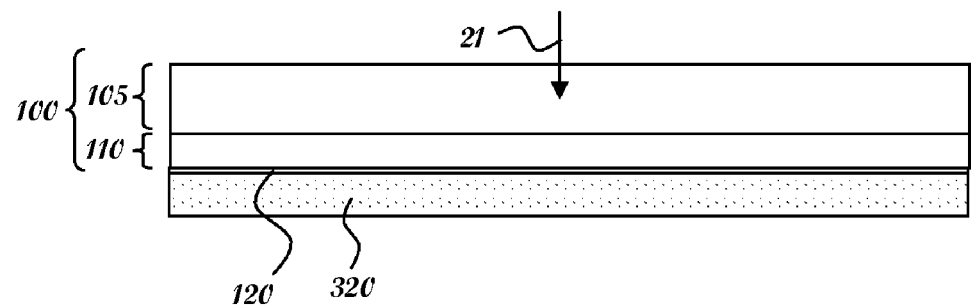
FIGS. 4a-4d are a series of cross-sectional views showing the sequence of some of the major steps of fabricating a liquid crystal imager in another embodiment of the present invention.
Figure 4B:
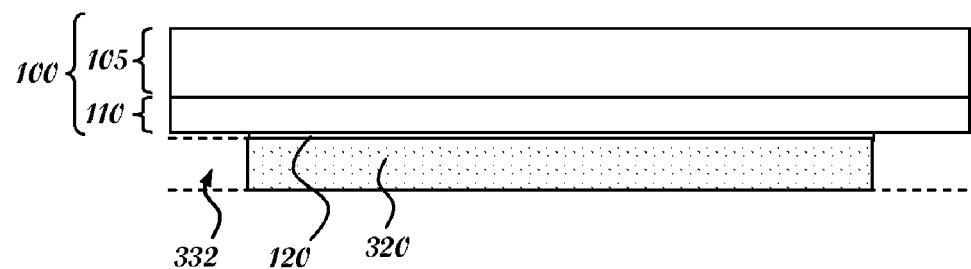
Figure 4C:
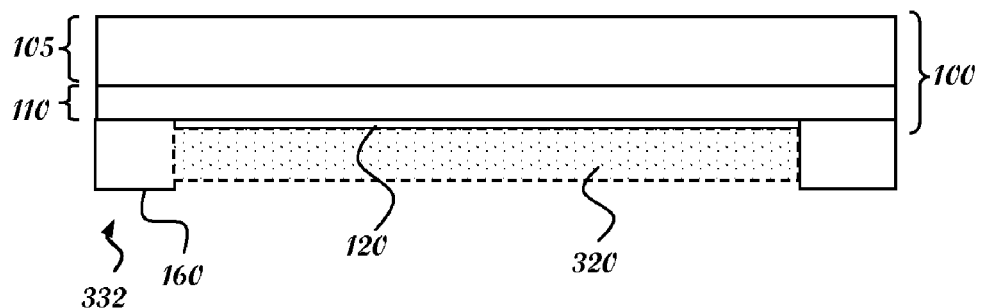
Figure 4D:
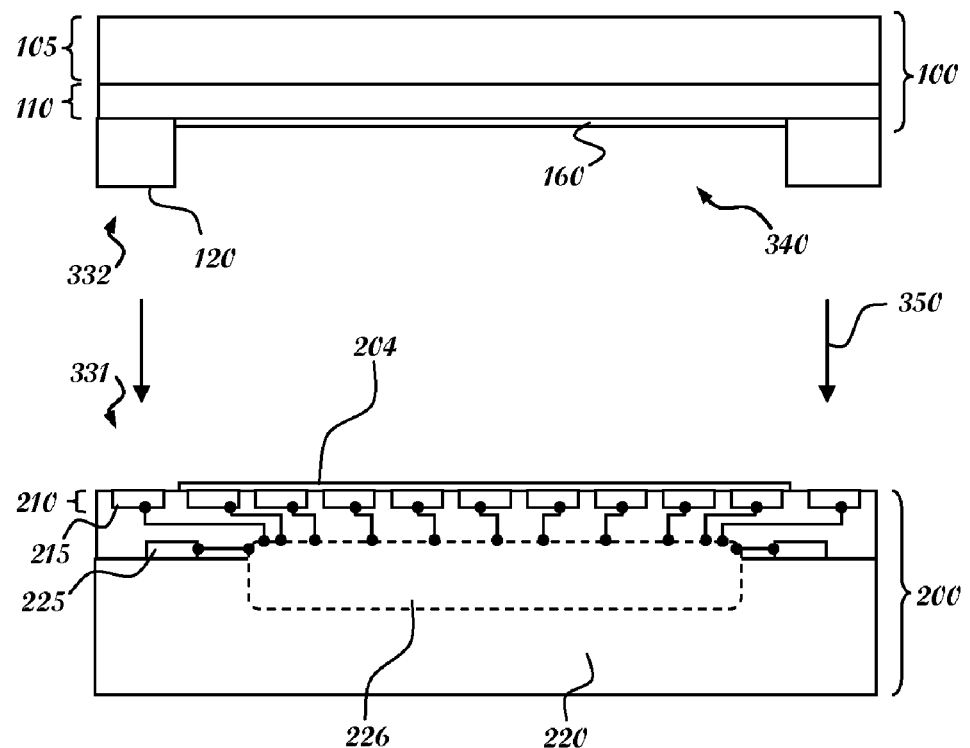

FIGS. 4a-4d are a series of cross-sectional views showing the sequence of some of the major steps of fabricating liquid crystal imagers 10 according to another embodiment of the present invention. Alternatively, the conductive seal ring 160 is fabricated onto the top liquid crystal alignment film 120 and the transparent conductive coating 110 at the bottom side of the transparent front plane substrate 105. Herein the transparent conductive coating 110 and the top liquid crystal alignment film 120, preferably made of inorganic materials such as silicon oxides and/or silicon nitrides, are deposited in sequence onto the bottom side of the transparent front plane substrate 105, followed by depositing the second sacrificial coating 320 as shown in FIG. 4a. Then the second sacrificial coating 320 is lithographically patterned to form the second grid of trenches 332, through the top liquid crystal alignment film 120 to expose the transparent conductive coating 110 partially (FIG. 4b). The conductive sealing ring 160 is produced as stated above with the excess part removed and the second sacrificial coating 320 is removed selectively (FIG. 4c). Equivalently, as shown in FIG. 4d, the thus processed transparent front plane plate 100 is finally bonded to the backplane plate 200 with bottom liquid crystal alignment film 204 formed and the transmit cell bond pad 215 exposed in an optical alignment between the first grid 331 and the second grid 332 such that the conductive seal ring 160 is bonded onto the transmit cell bond pad 215.

FIGS. 5a-5e are a series of cross-sectional views showing the sequence of some of the major steps of fabricating the thru-substrate via 227 on the backplane plate 200 according to an embodiment of the present invention. First, the backplane plate 200, comprising the active matrix driving circuitry 226, the input-output pads 225, the transmit cell connection pad 215 and the array of reflective pixel electrode 211 readily made, is coated with the bottom liquid crystal alignment film 204. Then the first sacrificial coating 310, preferably a solid state carbon film or a polyimide film, is deposited onto the bottom liquid crystal alignment film 204 preferably made of inorganic thin films including silicon oxide and/or silicon nitride. Using the first sacrificial coating 310 as protection coating on the backside as being flipped from bottom to top, the backplane plate 200 is lithographically etched to form openings of the thru-substrate via 227 through which the bottom side of the input-output pads 225 are exposed.

Figure 5A:
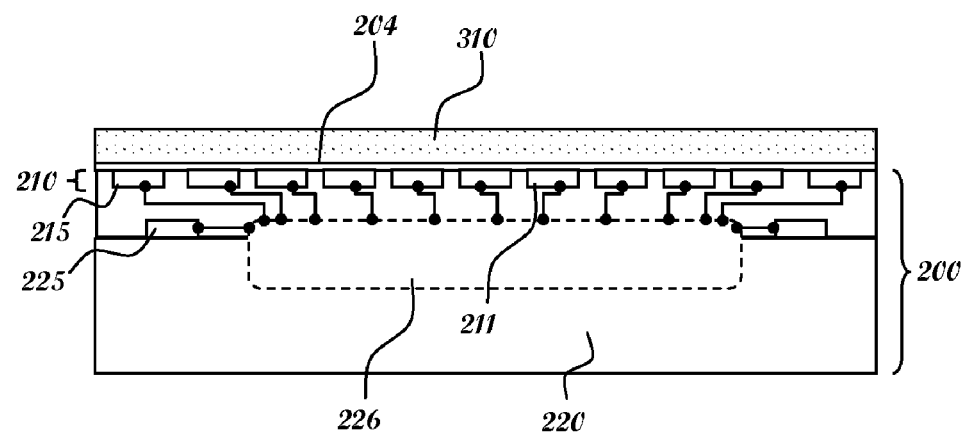
FIGS. 5a-5e are a series of cross-sectional views showing the sequence of some of the major steps of fabricating a thru-substrate via on a backplane plate according to an embodiment of the present invention.
Figure 5B:
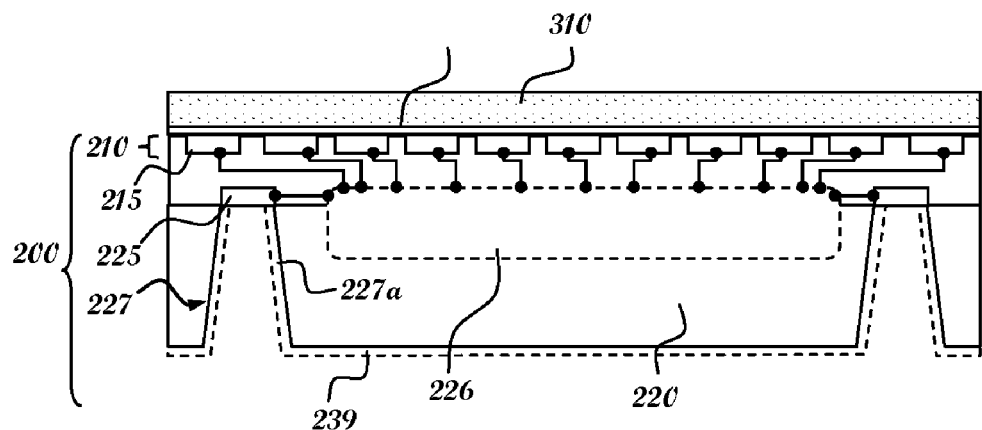
Figure 5C:
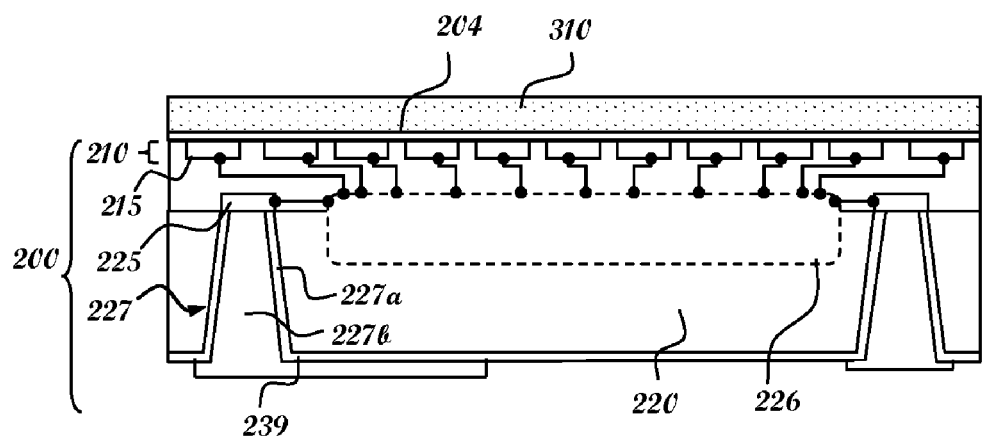
Figure 5D:
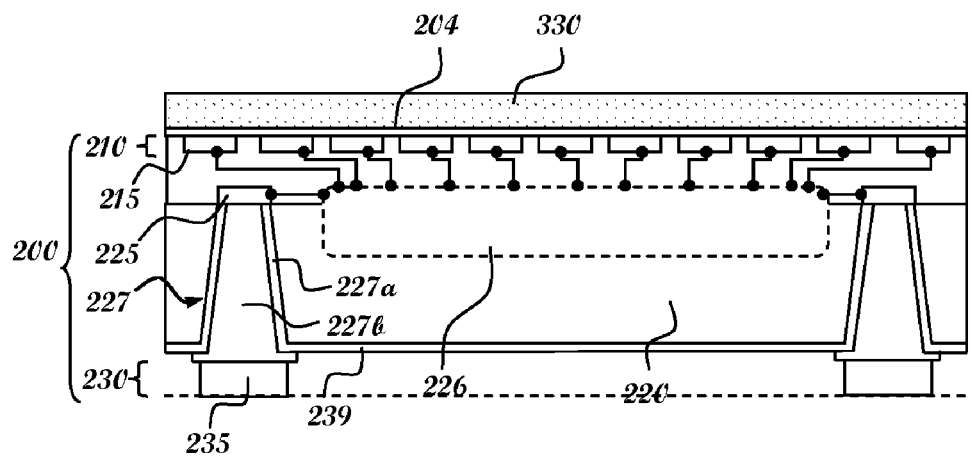
Figure 5E:
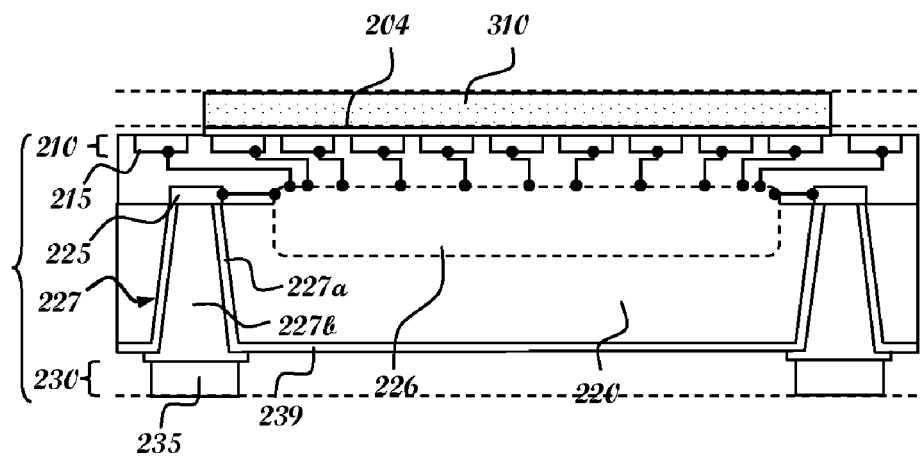

Then a dielectric isolation coating is deposited and etch patterned to re-expose the bottom side of the input-output pads 225 for forming the cylindrical isolation shell 227a and meanwhile, for forming the bottom bond pad isolator 239, as shown in FIG. 5b. Such dielectric isolation coating is preferably made of dielectric materials commonly available in semiconductor wafer backend fabrication process at temperatures below 400 degree Celsius, including but not limited to silicon oxides, nitrides and oxy nitrides. As shown in FIG. 5c, the thru-substrate conductors 227b are then formed through any combination of commonly used process modules, such as seed layer physical vapor deposition, wet and dry etching, electroplating and chemical mechanical polishing. Eventually, the bottom bond pads 235 are readily formed adhered to the thru-substrate conductors 227b also through those common used process modules, as shown in FIG. 5d.

As shown in FIG. 1, the conductive seal ring further comprises seal ring inner liner 161 preferably made from any or combination of silicon oxide, nitride, oxy nitride and carbide, carbon and carbon compounds, and polyimide, providing the physical isolation of liquid crystal cell from the conductive seal ring 160 to avoid any chemical contamination to liquid crystal filling. Meanwhile, the bottom bond pad isolator 239 is also preferably made from any or combination of silicon oxide, nitride, oxy nitride and carbide, carbon and carbon compounds, and polyimide, commonly available in the backend wafer process of silicon based semiconductor fabrication.

Providing electrical interconnection to the input-output bond pads 225, the thru-substrate conductor 227b and the bottom bond pads 235 are made from any or combination of aluminum, tungsten, copper, chrome, nickel, tin, silver and gold, which are commonly used in semiconductor wafer metallization and bumping processes.

Upon the bonding of the transparent front plane plate 100 to the backplane plate 200, the processed dies defined by each square of the collapsed first and second grids, 331 and 332 respectively, are separated by dicing through the bonded wafer stack. Thus the asymmetrical die sawing as disclosed in the prior art of U.S. Pat. No. 5,963,289 by Stefanov et al becomes unnecessary. Finally, the separated dies with the cavities 340 thus formed are then filled with a liquid crystal material, for example, through one or more inlets at the conductive seal ring 160 created on the edge of each die by dicing, and end-sealed to complete the process and product using properly chosen gasket glues, as disclosed in the prior art and widely used in commercial practice of liquid crystal on silicon imagers.

The invention thus provides efficiency-improved methods of manufacture and production arrangements for large scale manufacture of liquid crystal on silicon imagers with also incorporate thru-substrate interconnects and backside bond pads, more convenient to the imager to system board integration.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the scope of the present invention and covered in the claims of the present invention.

What is claimed is:

1. A liquid crystal imager comprising:
    a transparent front plane plate, the transparent front plane plate including transparent front plane substrate, a transparent conductive coating and a top liquid crystal alignment film;
    a planar liquid crystal cell, the planar liquid crystal cell including a conductive seal ring and a liquid crystal filling enclosed by the conductive seal ring;
    a backplane plate, the backplane plate including a bottom liquid crystal alignment film, an electrode array layer and a backplane substrate, the electrode array layer containing a transmit cell connection pad and an planar array of reflective pixel electrodes and being electrically isolated by an electrode isolator, and the backplane substrate containing an active matrix driving circuitry; wherein the backplane plate further comprises: a set of input-output pads, the input-output pads being electrically connected to the active matrix driving circuitry; a bottom connection pad layer, the bottom connection pad layer containing a set of bottom bond pads of an equal number to the input-output pads; a set of thru-substrate via, the thru-substrate via electrically connecting the input-output pads to the bottom bond pads individually;
    wherein the conductive seal ring electrically connects the transparent conductive coating to the transmit cell connection pad; the driving circuitry are electrically connected to the transmit cell connection pad and the planar array of reflective pixel electrodes.

2. The liquid crystal imager of claim 1, wherein the transparent front plane substrate is made from silicon oxide and the transparent conductive coating is made from any or combination of indium tin oxide, indium zinc oxide, nano carbon tubes and conductive polymers.

3. The liquid crystal imager of claim 1, wherein the top liquid crystal alignment film and the bottom liquid crystal alignment film are made from any or combination of silicon oxide and silicon nitride.

4. The liquid crystal imager of claim 1, wherein the backplane substrate is made from a solid state semiconductor.

5. The liquid crystal imager of claim 4, wherein each of the thru-substrate via further comprises a cylindrical isolation shell surrounding a thru-substrate conductor and the bottom bond pads are electrically isolated from the backplane substrate by a bottom pad isolation layer.

6. The liquid crystal imager of claim 5, wherein the semiconductor is made of silicon, the electrode isolator as well as the bottom pad isolation layer are made of any or combination of silicon oxide, nitride and oxynitride, aluminum oxide and nitride, and tantalum oxide.

7. The liquid crystal imager of claim 4, wherein the solid state semiconductor is silicon and the active matrix driving circuitry comprises complementary and symmetrical pairs of p-type and n-type metal oxide semiconductor field effect transistors.

8. The liquid crystal imager of claim 1, wherein the conductive seal ring is made from any or combination of aluminum, copper, chrome, nickel, tin, silver and gold.

9. The liquid crystal imager of claim 1, wherein the conductive seal ring is made from photo definable conductive glue.

10. The liquid crystal imager of claim 1, wherein the bottom bond pads are electrically isolated by a bottom bond pad isolatormade from any or combination of silicon oxide, nitride, oxy nitride and carbide, carbon and carbon compounds.

11. The liquid crystal imager of claim 1, wherein the thru-substrate via and the bottom bond pads are made from any or combination of aluminum, tungsten, copper, cobalt, nickel, tin, silver and gold.

12. A liquid crystal imager comprising:
a transparent front plane plate, the transparent front plane plate including transparent front plane substrate, a transparent conductive coating and a top liquid crystal alignment film;
a planar liquid crystal cell, the planar liquid crystal cell including a conductive seal ring and a liquid crystal filling enclosed by the conductive seal ring;
a backplane plate, the backplane plate including a bottom liquid crystal alignment film, an electrode array layer and a backplane substrate, the electrode array layer containing a transmit cell connection pad and an planar array of reflective pixel electrodes and being electrically isolated by an electrode isolator, and the backplane substrate containing an active matrix driving circuitry;
wherein the conductive seal ring electrically connects the transparent conductive coating to the transmit cell connection pad; the driving circuitry are electrically connected to the transmit cell connection pad and the planar array of reflective pixel electrodes;
wherein the planar liquid crystal cell further comprises an inner isolation ring separating the conductive seal ring from the liquid crystal filling.

13. The liquid crystal imager of claim 12, wherein the backplane plate further comprises:
a set of input-output pads, the input-output pads being electrically connected to the active matrix driving circuitry;
a bottom connection pad layer, the bottom connection pad layer containing a set of bottom bond pads of an equal number to the input-output pads;
a set of thru-substrate via, the thru-substrate via electrically connecting the input-output pads to the bottom bond pads individually.

14. The liquid crystal imager of claim 12, wherein the inner isolation ring is made from any or combination of silicon oxide, nitride, oxy nitride and carbide, carbon and carbon compounds including solid state polymers.

15. A method of manufacturing liquid crystal imagers, the method comprising the steps of:
providing a backplane plate having a plurality of processed dies, the processed dies arranged in a generally orthogonal array with horizontal and vertical scribe lines between the processed dies, each processed die containing a set of input-output pads and an active matrix driving circuitry on a backplane substrate, and an electrode array layer which comprises a transmit cell connection pad and a planar array of reflective pixel electrodes;
providing a transparent front plane substrate;
depositing a conductive transparent coating on the transparent front plane substrate;
forming a top liquid crystal alignment film onto the conductive transparent coating;
depositing a second sacrificial coating onto the top liquid crystal alignment film;
photolithographically patterning the second sacrificial coating to form a second grid of trenches through the second sacrificial coating, each gridded square in association with one processed die;
using the patterned second sacrificial coating as photolithographic mask, etching the top liquid crystal alignment film to selectively expose the conductive transparent coating according to the second grid of trenches;
selectively removing the second sacrificial coating;
adherently bonding the transparent front plane substrate to the backplane plate in an optical alignment such that an array of conductive sealing rings adhere to the exposed conductive transparent coating beneath the transparent front plane substrate and to the transmit cell connection pad above the backplane plate to form an array of cavities surrounded by the array of conductive sealing rings;
dicing through the bonded pair of the transparent front plane substrate and the backplane plate along the horizontal and vertical scribe lines to separate the processed dies;
filling and sealing the cavity of each processed die with liquid crystal material to form a liquid crystal imager.

16. The method of claim 15, further comprising:
forming a bottom liquid crystal alignment film on the backplane plate;
depositing a first sacrificial coating onto the bottom liquid crystal alignment film;
photolithographically patterning the first sacrificial coating to form a first grid of trenches through the first sacrificial coating, each gridded square in association with one processed die;
using the patterned first sacrificial coating as photolithographic mask, etching the bottom liquid crystal alignment film to selectively expose the transmit cell connection pad according to the first grid of trenches;
depositing a conductive sealant film to fill the first grid of trenches;
selectively removing the excess sealant film beyond the first grid of trenches;
selectively removing the first sacrificial coating to form an array of conductive seal rings defined by the first grid of trenches.

17. The method of claim 16, wherein the second grid of trenches are substantially identical to the first grid of trenches on the backplane plate.

18. The method of claim 15, further comprising depositing the top liquid crystal alignment film and the bottom liquid crystal alignment film through any or combination of evaporation or sputtering from a tilted planar target source relative to the backplane plate.

19. The method of claim 18 further comprising:
photolithographically patterning the opposite side of the backplane plate to form a set of thru-substrate via up to the input-output pads of each processed die;
producing cylindrical isolation shells inside the thru-substrate via and bottom bond pad isolator on the backside of backplane plate;
depositing thru-substrate conductors inside the cylindrical shells, the thru-substrate conductors being electrically connected to the input-output pads;

forming bottom bond pads on the bottom surface of the backplane plate, each bottom bond pad being electrically connected to one of the input-output pads;

after depositing a first sacrificial coating and before photolithographically patterning the first sacrificial coating.

20. A method of manufacturing liquid crystal imagers on a wafer backplane substrate, the method comprising the steps of:

providing a backplane plate having a first grid of trenches and a plurality of processed dies, the processed dies arranged in a generally orthogonal array with horizontal and vertical scribe lines between the processed dies, each processed die containing a set of input-output pads and an active matrix driving circuitry on a backplane substrate, and an electrode array layer which comprises a transmit cell connection pad and a planar array of reflective pixel electrodes;

providing a transparent front plane substrate;

depositing a conductive transparent coating on the transparent front plane substrate;

forming a top liquid crystal alignment film on top of the conductive transparent coating;

depositing a second sacrificial coating onto the top liquid crystal alignment film;

photolithographically patterning the second sacrificial coating to form a second grid of trenches through the second sacrificial coating, each gridded square in association with one processed die;

using the patterned second sacrificial coating as photolithographic mask, etching the top liquid crystal alignment film to selectively expose the conductive transparent coating according to the second grid of trenches, substantially identical to the first grid of trenches on the backplane plate;

depositing a conductive sealant film to fill the second grid of trenches;

selectively removing the excess sealant film beyond the second grid of trenches;

selectively removing the second sacrificial coating to form an array of conductive seal rings;

adherently bonding the transparent front plane substrate to the backplane plate in an optical alignment such that the array of conductive sealing rings adhere to the exposed conductive transparent coating beneath the transparent front plane substrate and to the transmit cell connection pad above the backplane plate to form an array of cavities surrounded by the array of conductive sealing rings;

dicing through the bonded pair of the transparent front plane substrate and the backplane plate along the horizontal and vertical scribe lines to separate the processed dies;

filling and sealing the cavity of a processed die with liquid crystal material to form a liquid crystal imager.

21. The method of claim 20, further comprising:

forming a bottom liquid crystal alignment film on the backplane plate;

depositing a first sacrificial coating onto the bottom liquid crystal alignment film;

photolithographically patterning the first sacrificial coating to form a first grid of trenches through the first sacrificial coating, each gridded square in association with one processed die;

using the patterned first sacrificial coating as photolithographic mask, etching the liquid crystal alignment film to selectively expose the transmit cell connection pad according to the first grid of trenches;

selectively removing the first sacrificial coating.

22. The method of claim 21, wherein the second grid of trenches are substantially identical to the first grid of trenches on the backplane plate.

23. The method of claim 20 further comprising:

photolithographically patterning the opposite side of the backplane plate to form a set of thru-substrate via up to the input-output pads of each processed die;

producing cylindrical isolation shells inside the thru-substrate via and bottom bond pad isolator on the backside of backplane plate;

depositing thru-substrate conductors inside the cylindrical shells, the thru-substrate conductors being electrically connected to the input-output pads;

forming bottom bond pads on the bottom surface of the backplane plate, each bottom bond pad being electrically connected to one of the input-output pads;

after depositing a first sacrificial coating and before photolithographically patterning the first sacrificial coating.

24. The method of claim 23, further comprising depositing the top liquid crystal alignment film and the bottom liquid crystal alignment film through any or combination of evaporation or sputtering from a tilted planar target source relative to the backplane plate.

* * * * *